US012672382B2

(12) United States Patent
Ryu et al.

(10) Patent No.: US 12,672,382 B2
(45) Date of Patent: Jun. 30, 2026

(54) GEIGER-MODE AVALANCHE PHOTODIODE ARRAYS FABRICATED ON SILICON-ON-INSULATOR SUBSTRATES

(71) Applicant: Massachusetts Institute of Technology, Cambridge, MA (US)

(72) Inventors: Kevin Ryu, Arlington, MA (US);
Joseph S. Ciampi, Westford, MA (US);
Brian F. Aull, Cambridge, MA (US);
Kevan Donlon, Arlington, MA (US);
Renee D. Lambert, Framingham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 599 days.

(21) Appl. No.: 18/155,876

(22) Filed: Jan. 18, 2023

(65) Prior Publication Data

US 2023/0299225 A1     Sep. 21, 2023

Related U.S. Application Data

(60) Provisional application No. 63/321,503, filed on Mar. 18, 2022.

(51) Int. Cl.
H10F 71/00 (2025.01)
H10F 30/225 (2025.01)
(Continued)

(52) U.S. Cl.
CPC ....... H10F 71/137 (2025.01); H10F 30/2255 (2025.01); H10F 39/016 (2025.01);
(Continued)

(58) Field of Classification Search
CPC .... H10F 71/137; H10F 71/128; H10F 71/129; H10F 71/121; H10F 30/2255; H10F 39/016; H10F 39/018; H10F 39/026; H10F 39/028; H10F 39/103; H10F 39/107; H10F 39/18; H10F 39/809; H10F 39/811; H10F 77/122; H10F 77/933; H10F 77/959; H01L 25/167
See application file for complete search history.

(56) References Cited

U.S. PATENT DOCUMENTS

| | | | |
|---|---|---|---|
| 11,372,119 B2 | 6/2022 | Aull et al. | |
| 2006/0043438 A1* | 3/2006 | Holm | ............ H10F 39/199 |
| | | | 257/291 |

(Continued)

OTHER PUBLICATIONS

Zou et al., "Backside illuminated wafer-to-wafer bonding single photon avalanche diode array," 2014 10th Conference on Ph.D. Research in Microelectronics and Electronics (PRIME), Grenoble, 2014, pp. 1-4, doi: 10.1109/PRIME.2014.6872751 (Year: 2014).*
(Continued)

*Primary Examiner* — Sitaramarao S Yechuri
(74) *Attorney, Agent, or Firm* — Smith Baluch LLP

(57) ABSTRACT

Fabrication of avalanche photodiodes on a first wafer for operation in Geiger mode and integration with read-out integrated circuits (ROICs), fabricated on a second wafer, are described. Photodiode arrays are fabricated using a thin epitaxial layer grown on a semiconductor-on-insulator wafer. Chips are diced from the first wafer and bump bonded to chips diced from the second wafer.

19 Claims, 10 Drawing Sheets

(51) Int. Cl.

| | |
|---|---|
| *H10F 39/00* | (2025.01) |
| *H10F 39/10* | (2025.01) |
| *H10F 39/18* | (2025.01) |
| *H10F 77/00* | (2025.01) |
| *H10F 77/122* | (2025.01) |

(52) U.S. Cl.
CPC ......... *H10F 39/018* (2025.01); *H10F 39/026* (2025.01); *H10F 39/028* (2025.01); *H10F 39/103* (2025.01); *H10F 39/107* (2025.01); *H10F 39/18* (2025.01); *H10F 39/809* (2025.01); *H10F 39/811* (2025.01); *H10F 71/128* (2025.01); *H10F 71/129* (2025.01); *H10F 77/122* (2025.01); *H10F 77/933* (2025.01); *H10F 77/959* (2025.01)

(56) References Cited

U.S. PATENT DOCUMENTS

| | | | | |
|---|---|---|---|---|
| 2020/0319355 | A1* | 10/2020 | Aull | H10F 39/199 |
| 2022/0158009 | A1* | 5/2022 | Jin | H10F 77/148 |
| 2023/0071740 | A1* | 3/2023 | Tsutsui | H10F 39/1515 |

OTHER PUBLICATIONS

Aull et al., "Mitigation of optical crosstalk in Geiger-mode avalanche photodiode arrays for lidar," Advanced Photon Counting Techniques XVI. vol. 12089. SPIE, 2022, 8 pages.

Aull, "3D imaging with Geiger-mode avalanche photodiodes." Optics and Photonics News 16.5 (2005): 42-46.

Clifton et al., "Medium altitude airborne Geiger-mode mapping LIDAR system," Laser Radar Technology and Applications XX; and Atmospheric Propagation XII. vol. 9465. SPIE, 2015, 9 pages.

Grein et al., "Efficient communication at telecom wavelengths using wavelength conversion and silicon photon-counting detectors," Free-Space Laser Communications VII. vol. 6709. SPIE, 2007, 5 pages.

Punjiya et al., "A Direct Detection LiDAR Detector for the Europa Lander Concept," Advanced Photon Counting Techniques XVI. vol. 12089. SPIE, 2022, 11 pages.

Ryu et al. "Geiger-mode avalanche photodiode arrays fabricated on SOI engineered-substrates." Advanced Photon Counting Techniques XVI. vol. 12089. SPIE, 2022, 9 pages.

Ryu et al. PowerPoint Slides from SPIE Conference, Geiger-mode avalanche photodiode arrays fabricated on SOI engineered-substrates, Proceedings vol. 12089, Advanced Photon Counting Techniques XVI; 120890C https://doi.org/10.1117/12.2618610: SPIE Defense + Commercial Sensing, Orlando, Florida, United States, 2022, 18 pages.

Ryu et al., "Rapid prototyping of single-photonsensitive backside-illuminated silicon avalanche photodiode arrays," Image Sensing Technologies: Materials, Devices, Systems, and Applications VI. vol. 10980. SPIE, 2019, 9 pages.

Schuette et al., "Hybridization process for back-illuminated silicon Geiger-mode avalanche photodiode arrays." Advanced Photon Counting Techniques IV. vol. 7681. SPIE, 2010, 8 pages.

* cited by examiner this work

Commercial SOI wafer    Implant BF₂ and anneal    Epitaxial growth of high resistivity silicon to 5 um related work Device Wafer    Implant BF₂

Handle Wafer    Grow 100 nm thermal oxide    Face-to-face oxide bond    Bond anneal, Thin device layer to target thickness

| chemical element | | related work | this work |
|---|---|---|---|
| Aluminum | (Al) | 0.70 | <0.3 |
| Antimony | (Sb) | <0.004 | 0.0043 |
| Arsenic | (As) | <1 | <0.5 |
| Barium | (Ba) | 0.024 | <0.002 |
| Beryllium | (Be) | <0.4 | <0.2 |
| Bismuth | (Bi) | <0.002 | <0.001 |
| Boron | (B ) | 92 | 180 |
| Cadmium | (Cd) | <0.006 | <0.003 |
| Calcium | (Ca) | 1.2 | <0.3 |
| Chromium | (Cr) | <0.1 | <0.06 |
| Cobalt | (Co) | <0.1 | <0.05 |
| Copper | (Cu) | 2.2 | 0.031 |
| Gallium | (Ga) | <0.006 | <0.003 |
| Germanium | (Ge) | 0.097 | 0.049 |
| Iron | (Fe) | 0.24 | <0.1 |
| Lead | (Pb) | <0.006 | <0.003 |
| Lithium | (Li) | <0.1 | <0.05 |
| Magnesium | (Mg) | 0.47 | <0.1 |
| Manganese | (Mn) | <0.06 | <0.03 |
| Molybdenum | (Mo) | <0.004 | 0.015 |
| Nickel | (Ni) | 0.42 | <0.05 |
| Potassium | (K ) | 5.5 | <0.2 |
| Sodium | (Na) | 1.0 | <0.2 |
| Strontium | (Sr) | <0.02 | <0.01 |
| Tin | (Sn) | 0.18 | <0.03 |
| Titanium | (Ti) | 0.50 | <0.05 |
| Tungsten | (W ) | <0.002 | 0.032 |
| Vanadium | (V ) | <0.02 | <0.01 |
| Zinc | (Zn) | 0.57 | <0.05 |
| Zirconium | (Zr) | 0.053 | <0.01 | units: $10^{10}$ atoms/cm$^2$

*FIG. 4*

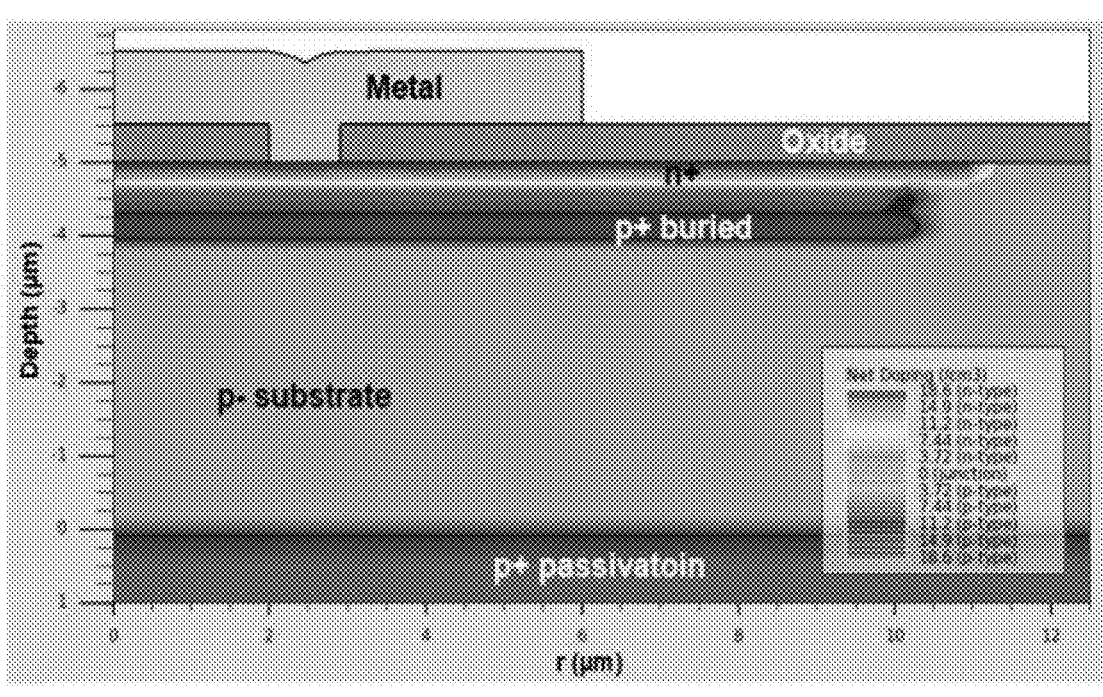
*FIG. 5A*
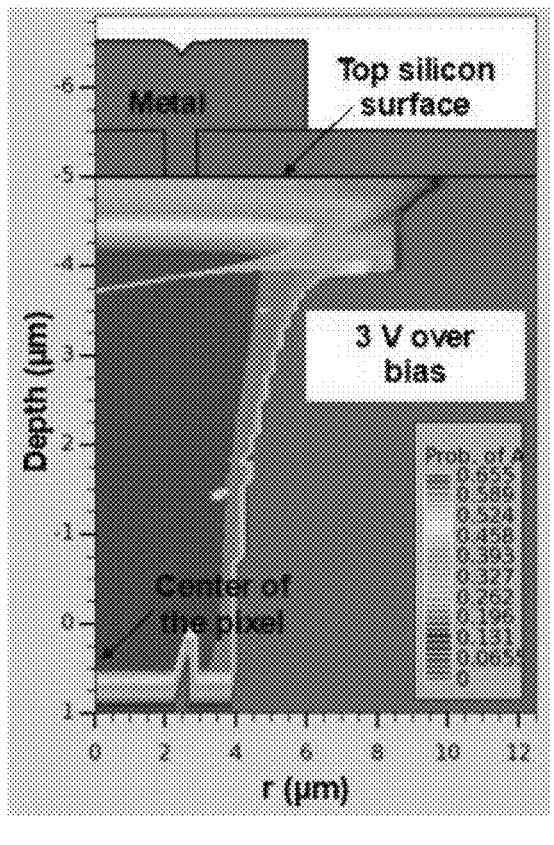
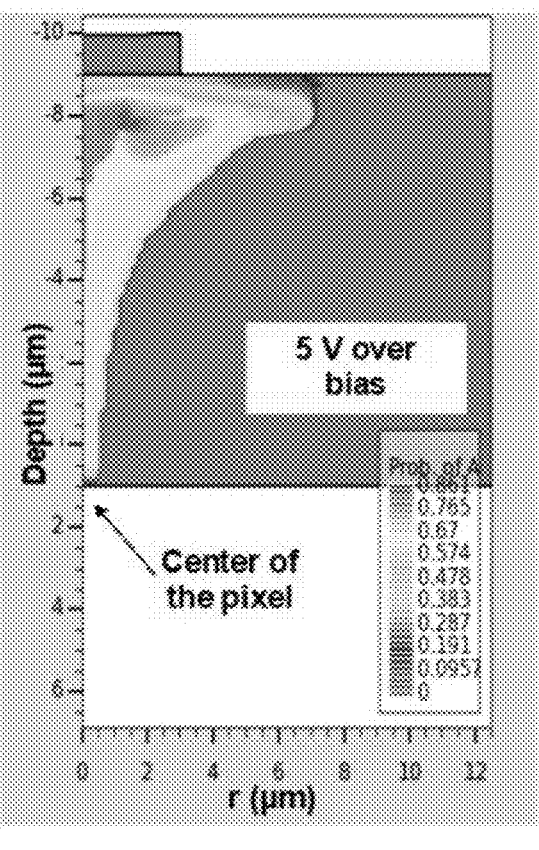
*FIG. 5B*                    *FIG. 5C*

GEIGER-MODE AVALANCHE PHOTODIODE ARRAYS FABRICATED ON SILICON-ON-INSULATOR SUBSTRATES

CROSS-REFERENCE TO RELATED APPLICATION(S)

This application claims the priority benefit, under 35 U.S.C. 119(e), of U.S. application Ser. No. 63/321,503, filed Mar. 18, 2022, which is incorporated by reference herein in its entirety for all purposes.

STATEMENT OF GOVERNMENT RIGHTS

This invention was made with government support under 80NM00-18-D-0004 awarded by the National Aeronautics and Space Administration. The government has certain rights in the invention.

BACKGROUND

Geiger-mode avalanche photodiodes (GmAPDs), also referred to as single-photon avalanche diodes (SPADs), can provide fast timing accuracy and single photon detection. Paired with CMOS read-out integrated circuits (ROICs), they can be used in lidar applications as well as high-speed optical communication and other applications. Silicon GmAPDs have low defect densities, leading to low dark count rates (DCRs) with minimal cooling and high yields. The silicon band gap is 1.1 eV and provides detection for ultraviolet (UV) to near-infrared (NIR) wavelength bands up to 1100 nm.

There are two different approaches for integrating GmAPDs to ROICs. One approach is to fabricate GmAPDs and ROICs on separate wafers and integrate the GmAPD device and ROIC via 3D integration or hybridization. In 3D integration, chips are bonded together and metal traces on the chips are connected (e.g., with bond wires). In hybridization, the chips are bonded together with bump bonds, which also provide electrical interconnects. The other approach is to microfabricate GmAPDs and ROICs on the same wafer (e.g., forming the ROIC and then the photodiodes with sequences of microfabrication steps performed on the same wafer). Fabricating GmAPDs and ROICs on the same wafer can lead to lower cost for volume production and faster GmAPD timing resolution.

Using hybridization leads to better detector performance as the process can be tuned for each layer. Also, with hybridization, more area is available for both GmAPDs and ROICs for a given pixel size. The hybridization approach also presents a lower risk and cost in small volume production for achieving the performance desired for certain applications. This approach allows development and characterization of the GmAPD arrays using existing ROICs while new ROICs can be developed in parallel. This approach also reduces the timing schedule for a new fabrication run for the GmAPD array (e.g., to improve crosstalk suppression of the GmAPD array).

SUMMARY

The described technology relates to methods for fabricating first devices (such as avalanche photodiodes for Geiger-mode avalanche photodiode arrays, for example) on a first wafer and integrating the first devices with second devices (such as biasing and read-out integrated circuitry) that are fabricated on a second wafer. The wafers can be of the same semiconductor type (e.g., both silicon wafers) or of different semiconductor type (e.g., one silicon wafer and one indium phosphide or gallium arsenide wafer). The first devices can be fabricated in a thin layer of semiconductor material on the first wafer. For example, the first wafer can be a silicon-on-insulator wafer and the first devices formed in a device layer that is epitaxially grown on the thin silicon layer that sits on the insulating layer of the silicon-on-insulator wafer. In some cases, a chip cut from the first wafer can be bump bonded to a chip cut from the second wafer to integrate a first device with a second device. After bump bonding, a majority of the semiconductor substrate can be removed from the first wafer.

Some implementations relate to a method of fabricating a hybridized sensor, the method comprising: implanting ions into a silicon layer of a silicon-on-insulator wafer to create a passivation layer; growing a device layer on the passivation layer; forming a sensor array in the device layer; dicing the silicon-on-insulator wafer into a chip containing the sensor array; and hybridizing the chip to a read-out integrated circuit (ROIC).

Some implementations relate to a method of fabricating a hybridized sensor, the method comprising: implanting ions into a semiconductor layer of a semiconductor-on-insulator (SOI) wafer to create a passivation layer, the SOI wafer comprising the semiconductor layer, a buried oxide layer, and a semiconductor substrate on a side of the buried oxide layer opposite the semiconductor layer; epitaxially growing a device layer on the passivation layer; forming a sensor in the device layer; forming a first metal contact electrically connected to the sensor; dicing the SOI wafer into a first chip containing the sensor; bump bonding the first chip to a read-out integrated circuit (ROIC) by electrically connecting the first metal contact to a second metal contact of the ROIC with a bump bond; and thinning the semiconductor substrate on the first chip so that optical radiation can enter the sensor from a surface of the sensor facing the buried oxide layer.

Some implementations relate to a method of fabricating a hybridized sensor array, the method comprising: implanting ions into a semiconductor layer of a semiconductor-on-insulator (SOI) wafer to create a passivation layer, the SOI wafer comprising the semiconductor layer, a buried oxide layer, and a semiconductor substrate on a side of the buried oxide layer opposite the semiconductor layer; epitaxially growing a device layer on the passivation layer; forming sensors in at least one array in the device layer; forming first metal contacts electrically connected to the sensors in the at least one array; dicing the SOI wafer into a first chip containing an array of sensors of the at least one array; bump bonding the first chip to a read-out integrated circuit (ROIC) by electrically connecting the first metal contacts to second metal contacts of the ROIC with a plurality of bump bonds; and thinning the semiconductor substrate on the first chip so that optical radiation can enter the array of sensors from a surface of the array of sensors facing the buried oxide layer.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. The terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar components).

FIG. 4 lists several contaminant levels for process-ready wafers formed using the processes of FIG. 3A and FIG. 3B.

FIG. 5A depicts the doping profiles in an example avalanche photodiode of FIG. 1.

FIG. 5B and FIG. 5C plot the avalanche probability of 5-μm and 10-μm-thick photodiodes, respectively.

DETAILED DESCRIPTION

Figure 1:
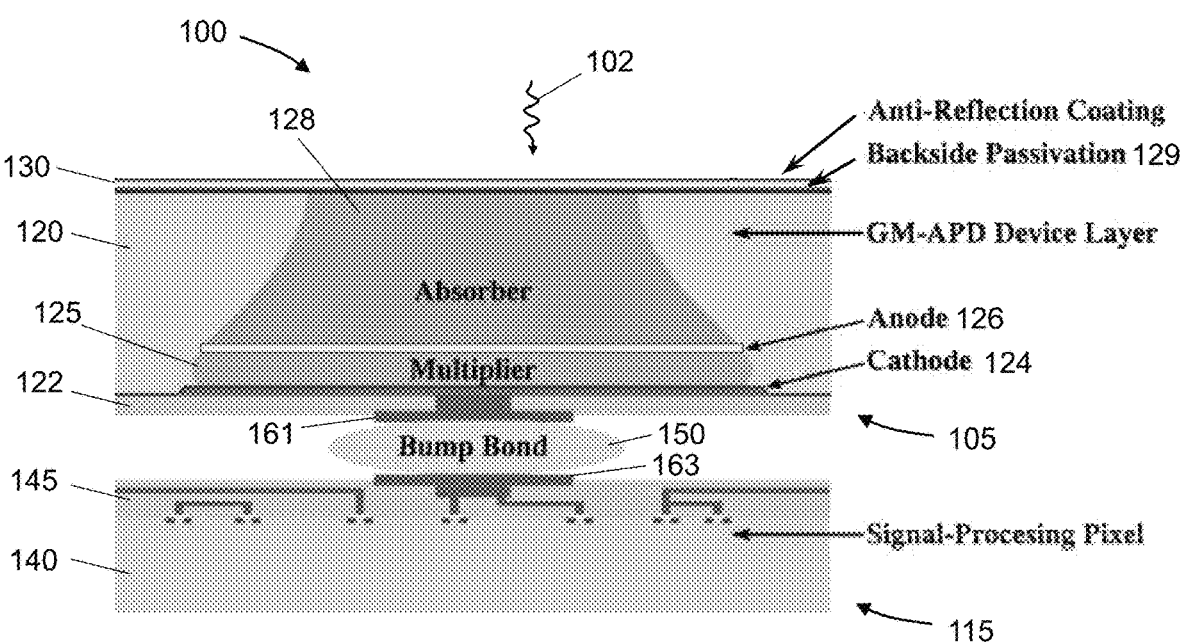
FIG. 1 depicts an example structure of an avalanche photodiode (which can be operated as a GmAPD) that is hybridized with a read-out integrated circuit (ROIC).

FIG. 1 depicts an example structure of a hybridized sensor element 100 that comprises an avalanche photodiode 105

(which can be operated in Geiger mode) integrated with a readout integrated circuit (ROIC) 115, a portion of which is shown in the drawing. The ROIC can include circuitry to bias the avalanche photodiode 105 to operate in Geiger mode as well as received signals from the avalanche photodiode 105. The avalanche photodiode 105 may also be referred to as a Geiger-mode avalanche photodiode (GmAPD) 105 in the following description, with it being understood that an avalanche photodiode 105 can be operated in avalanche or amplification mode (when reverse biased below its reverse breakdown voltage) and alternatively operated in Geiger mode (when reverse biased above its reverse breakdown voltage and connected to circuitry to quench the avalanche).

The GmAPD 105 can be manufactured in an array of avalanche photodiodes on a first wafer and the ROIC 115 can be manufactured on a second wafer such that readout metal contacts 163 patterned on an oxide layer 145 of the second wafer spatially align with locations of photodiode metal contacts 161 patterned on an oxide layer 122 of the first wafer. A first chip cut from the first wafer can be bonded, using bump bonds 150, to a second chip cut from the second wafer to form an optical sensor or imager, for example. The first chip can comprise a first substrate 120 and an array of GmAPDs 105. The second chip can comprise a second substrate 140 and a ROIC 115. Methods for making the GmAPDs 105 and hybridized sensor element 100 for an optical sensor or imager are described in further detail below.

The Geiger-mode avalanche photodiode 105 is a backside illuminated device in the illustrated example and has an absorber region 128 where an incoming photon 102 (from above the absorber region 128 in the drawing) is absorbed to create an electron-hole pair. The electron drifts toward the cathode 124 where it can pass through into the multiplier region 125. A large electric field is present in the multiplier region 125 due to a reverse bias between the cathode 124 and anode 126. The electric field in the multiplier region 125 can accelerate the electron enough to produce an avalanche of electrons flowing toward the cathode 124. The avalanche of electrons is detected as an electrical pulse by the ROIC 115, which subsequently extinguishes the avalanche by lowering the reverse bias applied to the photodiode. To increase device efficiency, an antireflection coating 130 can be applied to the GmAPD 105.

In U.S. Pat. No. 11,372,119, titled "Rapid Prototyping of Single-Photon-Sensitive Silicon Avalanche Photodiodes," issued Jun. 28, 2022, which patent is incorporated herein by reference in its entirety, a rapid prototyping approach is described for integrating GmAPDs to ROICs. Arrays of GmAPDs 105 are fabricated on an engineered substrate. The engineered substrate is produced by bonding two wafers together, among other processing steps. The substrate of the engineered substrate is subsequently thinned using a buried oxide as an etch-stop layer, as described further below.

This approach has several advantages for prototyping the hybridized sensor element 100 compared to wafer-level 3D integration. First, the finished GmAPD 105 arrays are electrically isolated from a handle wafer during the fabrication process so device characteristics, such as dark count rate (DCR), crosstalk, and current-voltage characteristics, can be measured just after fabrication of the avalanche photodiodes 105. Second, the schedule to produce the final prototype array is accelerated as it avoids extra coordination with ROIC devices in the design phase and extra processing steps for wafer-level backside-illumination. Third, the cost per development cycle is reduced since a dedicated full-wafer with ROIC fabrication is not needed.

1. Avalanche Photodiode Fabrication Process

Figure 2A:
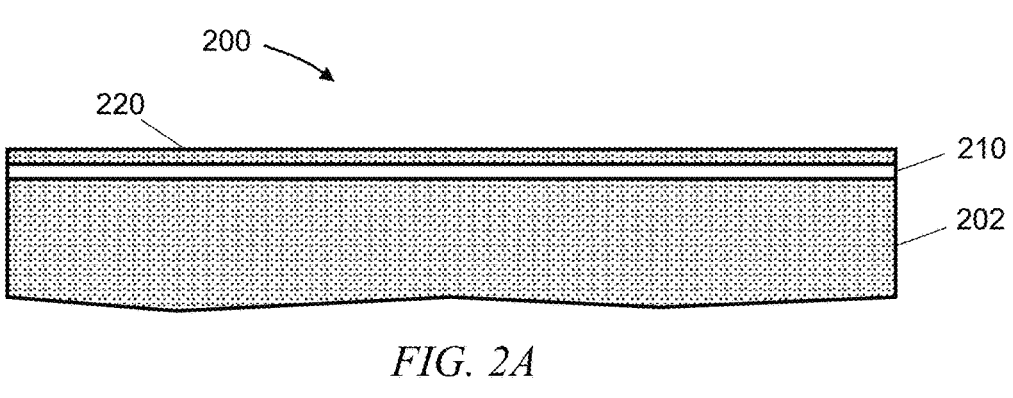
FIG. 2A, FIG. 2B, FIG. 2C, FIG. 2D, and FIG. 2E depict wafer structures corresponding to several different steps of an example process for making arrays of avalanche photodiodes like those depicted in FIG. 1.

FIG. 2A through FIG. 2E illustrate wafer structures corresponding to several different steps of a new process for making arrays of GmAPDs 105 that can be integrated with ROICs that are formed on a separate wafer. FIG. 2A depicts a portion of a commercial SOI wafer 200, which is a silicon-on-insulator wafer for the illustrated example. The SOI wafer 200 has a thick silicon substrate 202, buried oxide layer 210, and thin silicon top layer 220 on a side of the buried oxide layer 210 opposite the substrate 202. The thickness of the silicon substrate 202 can be from 200 microns to 800 microns, though other thicknesses can be used. The buried oxide 210 can have a thickness from 20 nm to 500 nm and the silicon top layer 220 can have a thickness from 20 nm to 500 nm. The thickness of the silicon top layer 220 can be different than the thickness of the buried oxide 210.

Though a silicon SOI wafer 200 is described in connection with the drawings, SOI wafers having other semiconductor materials may be used, such as indium phosphide, germanium, silicon-germanium, gallium arsenide, gallium nitride, etc. Additionally, sensor elements other than avalanche photodiodes 105 can be fabricated on the wafer instead of avalanche photodiodes using conventional microfabrication processes. Other sensor elements can include photodiodes for a charge-coupled device, CMOS photodiodes, sensor elements for active pixel sensors, etc. These other sensors can include p-n junctions. The structure of the avalanche photodiode in FIG. 1 would be replaced with the structure of the other sensor.

Figure 2B:
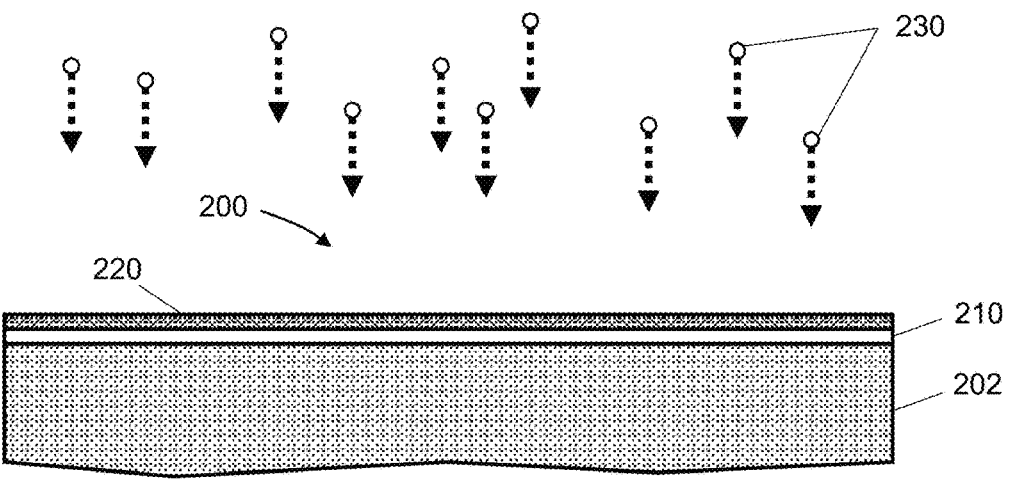

FIG. 2B depicts ion implantation of a dopant into the thin silicon top layer 220. A dopant 230 can be implanted to form a backside passivation layer 129 that will eventually be at or near an entrance surface of the GmAPDs where photons enter the absorbing region. The passivation layer 129 can reduce the DCR of the photodiode. In FIG. 1, the passivation layer 129 is located below the antireflection coating 130. For some implementations, the silicon top layer 220 has a thickness between 20 nm and 120 nm and the dopant 230 is difluoroboron ($BF_2$). After dopant implantation, an anneal can be performed to activate and disperse the dopant 230.

Figure 2C:
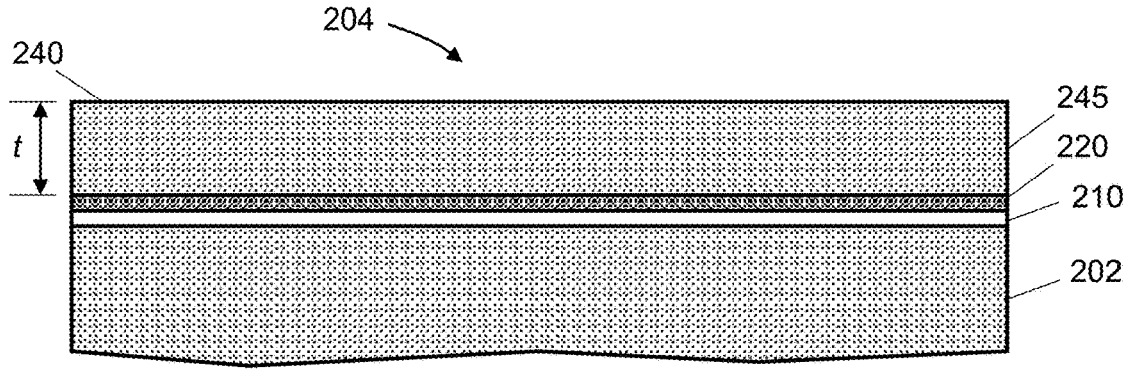
Figure 2D:
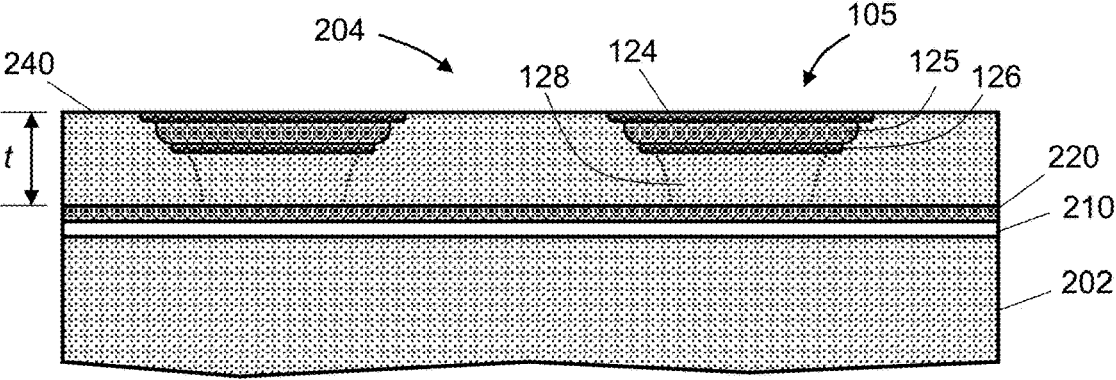

An epitaxial layer 240 of semiconductor (e.g., silicon or silicon-germanium) is then grown on the silicon top layer 220 to form a device layer 245, resulting in the process-ready wafer 204 shown in FIG. 2C. The device layer 245 can be grown to any desired thickness t (e.g., from 500 nanometers to 20 microns). According to some implementations, the thickness of the epitaxial layer 240 is between 500 nm and 10 μm.

Microlithography processes can then be performed on the wafer 200 of FIG. 2C to make one or more avalanche photodiodes 105 in the device layer 245 to operate in Geiger mode, for example. Two GmAPDs 105 are depicted in the portion of the wafer 200 in FIG. 2D. The microlithography can involve patterning with resists and performing ion implantations in several steps to dope active regions of the GmAPDs 105.

Figure 2E:
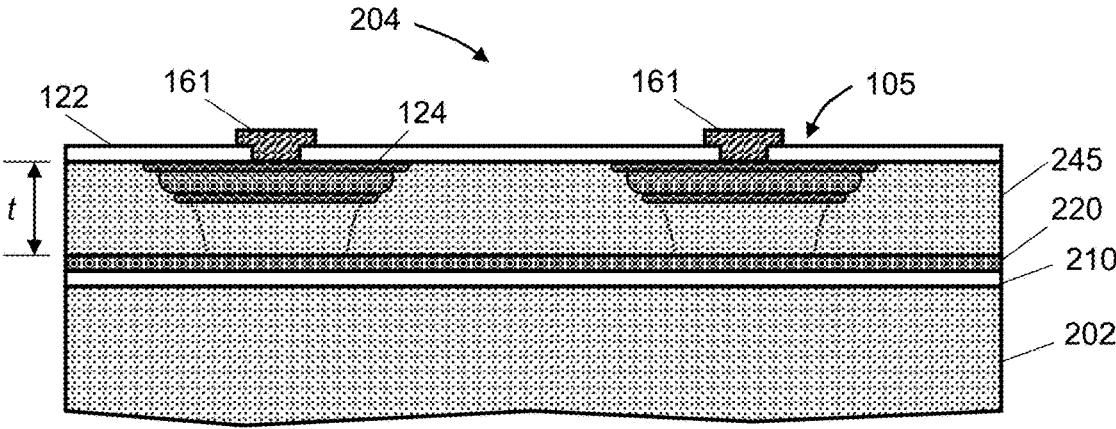

Subsequently, an oxide layer 122 (or other layer that is electrically insulating) can be deposited or grown on the wafer 200 (as illustrated in FIG. 2E) to cover the GmAPDs 105 and epitaxial layer 240. The thickness of the oxide layer 122 can be between 10 nm and 500 nm. A hole in the oxide layer 240 can be opened over each GmAPD 105 (using standard microfabrication processes) to expose the underlying semiconductor material. The hole(s) can be used to form one or more conductive vias that make electrical contact with the cathode(s) 124 of the avalanche photodiode(s) 105. The photodiode metal contact(s) 161 can then be deposited over the hole(s) in the oxide layer 122 (e.g., using a lift-off process). The photodiode metal contact(s) 161 can be used to bump bond a chip containing one or more GmAPDs 105 to a chip having a ROIC 115 resulting in one or an array of hybridized sensor elements 100, one of which is depicted in FIG. 1. The array may have regular, periodic spacing between elements in one or two dimensions or may have other spacings between the elements (e.g., unequal spacings or randomized spacings).

After bump bonding the chip containing one or more GmAPDs 105 to a chip containing a ROIC 115, the silicon substrate 202 can be removed by etching and/or mechanical methods (e.g., wet or dry etching, grinding, milling, photo-assisted etching, chemical-mechanical polishing). In some implementations, mechanical removal is used to remove most of the silicon substrate 202 (e.g., all except a residual thickness between 10 microns and 100 microns). The remaining thickness of the silicon substrate 202 can then be removed using a dry etching process (e.g., reactive ion etching using xenon difluoride gas) that does not etch the buried oxide layer 210 or etches the buried oxide layer at a much slower etch rate than silicon. In this manner, the buried oxide layer 210 acts as an etch stop. The structure of the resulting avalanche photodiode 105 (inverted and with the silicon substrate 202 and buried oxide layer 210 removed) is depicted in FIG. 1.

Optical radiation can enter the avalanche photodiode from a surface of the photodiode that faces the buried oxide layer. In some cases, the buried oxide layer 210 can be stripped from the chip to expose the passivation layer 129 and can be replaced with an anti-reflection coating 130 designed to reduce or minimize reflection of incident photons having a wavelength in a desired detection wavelength band for the hybridized sensor element(s) 100. In some implementations, the buried oxide layer 210 can be left on the chip and makes up, in part or whole, the anti-reflection coating 130. For example, the thickness of the buried oxide layer 210 can be chosen to significantly reduce reflection of incident photons having a wavelength in a desired detection wavelength band for the hybridized sensor element(s) 100. In some cases, the buried oxide layer 210 can be etched and/or polished to a desired thickness, suitable for an anti-reflection coating, after removal of the silicon substrate 202.

2. Comparison to a Related Process

The fabrication process described above improves upon the process described in U.S. Pat. No. 11,372,119 by eliminating some of the process steps described in that patent. In that related work, which is described further below in connection with FIG. 3B, a device wafer for fabricating the avalanche photodiodes was bonded to another semiconductor wafer having an oxide surface layer. The device wafer was then subsequently thinned (from about 750 microns to 10 microns) to form a thin semiconductor layer in which the avalanche photodiodes could be formed.

The steps of bonding and thinning a device wafer are eliminated in the new process described below in connection with FIG. 3A. Instead, a commercial semiconductor-on-insulator (SOI) wafer (silicon-on-insulator in the described example) is used for a process-ready wafer on which to form the GmAPDs 105. The silicon layer, on the insulator, is doped and then increased to a desired thickness by epitaxial growth for fabrication of the GmAPDs 105. This new approach avoids chemically thinning the device wafer after bonding, which left a rim of silicon on the wafer that was mechanically removed in the related work. That mechanical removal process sometimes led to breakage (lower yield) and may have caused metallic contamination. The present approach described below improves the cleanliness of the silicon layer, increases device yield, and reduces the cost of the wafers. Avalanche photodiodes produced by this new approach show reduced DCR.

Figure 3A:
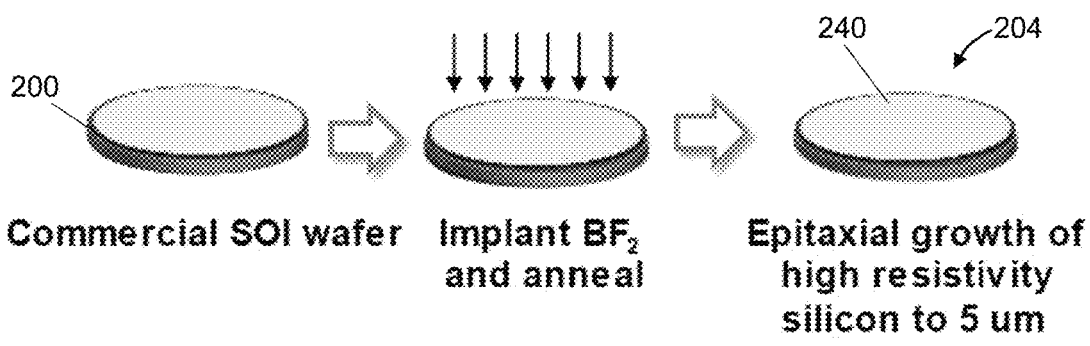
FIG. 3A illustrates a process for forming a process-ready wafer from a semiconductor-on-insulator (SOI) wafer.
Figure 3B:
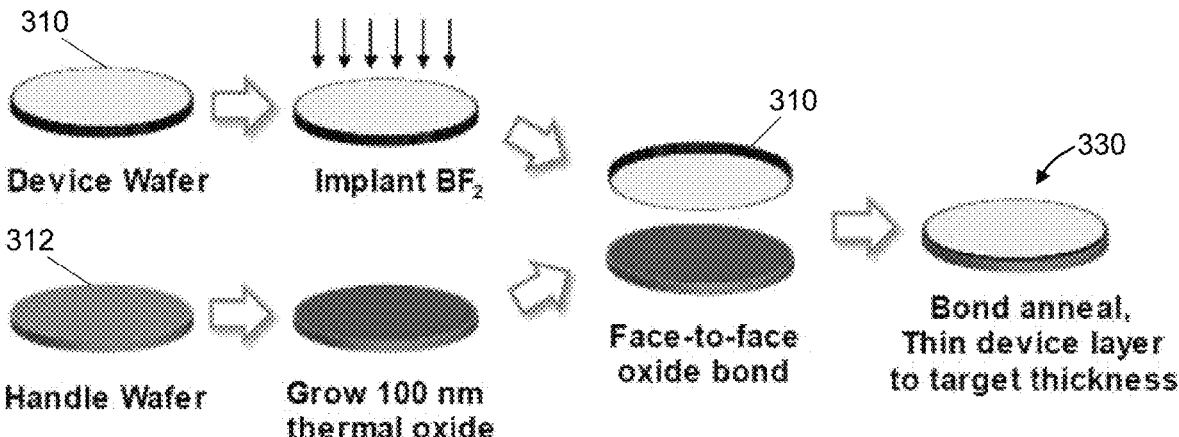
FIG. 3B illustrates another process for forming a process-ready wafer from an SOI wafer.

FIG. 3A and FIG. 3B compare a portion of the present process (FIG. 3A) for fabricating avalanche photodiodes with another process (FIG. 3B) described in U.S. Pat. No. 11,372,119. Each process results in a process-ready wafer 204, 330 on which the GmAPDs can be manufactured. The other process (FIG. 3B) starts with a device wafer 310 and handle wafer 312. The other process employs the bonding of the device wafer 310 and handle wafer 312 together and removal of most of the silicon substrate from the device wafer 310.

The present process (FIG. 3A) does not involve bonding two wafers together or removing most of the silicon substrate from one wafer during this portion of the manufacturing process. As described above, the present process starts with an SOI wafer, implants a dopant into the top semiconductor layer, and then epitaxially grows the top semiconductor layer to a desired thickness. The present process does not involve oxide growth on a handle wafer. The steps of oxide growth, wafer bonding, and substrate removal are replaced with the less costly step of epitaxial growth of semiconductor material for the device layer 245.

The present process of FIG. 3A has several improvements over the process of FIG. 3B. The resulting device layer 245 in which avalanche photodiodes 105 will be formed is cleaner since no mechanical removal of the silicon layer is used. It is also straightforward to make a thin device layer 245 as silicon (or other desired semiconductor) is grown to a desired thickness by epitaxy rather than thinned to a desired thickness by mechanical and/or etching methods. For example, a 1-micron-thick GmAPD 105 desired for a fast response in the blue or UV, where one micron is effective for absorbing most photons, can be readily fabricated using the approach depicted in FIG. 3A.

The inventors recognized and appreciated that the previous process of FIG. 3B exhibited some unwanted aspects. After bonding and annealing the wafers to improve bond strength and activate the boron implant, the device wafer 310 is thinned down to 10 μm thickness via chemical wet etching using an HF/nitric/acetic acid mixture. To prevent wafer shrinkage during wet-thinning, the edge of the wafer is protected from etching. This protection results in a "rim" of wafer which is not thinned. This rim is subsequently removed with a dicing saw. Although the surface of the wafer is protected with a resist during rim removal process, the process-ready wafers 330 can have surface contaminants after the rim removal process. The result of a vapor-phase decomposition inductively-coupled plasma mass spectrometry (VPD ICP-MS) analysis of the surface oxide after this process and a chemical clean of the oxide surface is shown in the table of FIG. 4, which also shows a comparable analysis for a process-ready wafer 204 formed according to the process described above in connection with FIG. 2A through FIG. 2C and FIG. 3A. The shaded and dark boxes show an increase in contaminants up to an order of magnitude or more.

In addition, the related process of FIG. 3B incurs a higher cost per wafer due to yield loss from bonding voids and from breakage during the rim-removal process. Also, the non-planar surface of the nearly process-ready wafer 330 after thinning is planarized with an extra chemical mechanical polish (CMP) process after oxide deposition in order to achieve clean removal of metal (e.g., tungsten) after a metal fill and CMP process. The metal fill process can be used to form conductive vias through the oxide, for example.

3. Fabrication of Example Geiger-Mode Avalanche Photodiodes

Several GmAPDs were simulated, and their avalanche photodiode structures fabricated according to the fabrication process described in connection with FIG. 2A through FIG. 2E and FIG. 3A. These example devices were fabricated using silicon-on-insulator wafers and epitaxially-grown silicon for the device layer 245.

Various thicknesses of the GmAPDs 105 were considered prior to device fabrication. Thinner photodiodes offer the benefit of lower radiation damage as the total photodiode volume is reduced. Thinner photodiodes also offer faster response and lower timing jitter as a smaller distance is traveled from charge generation to amplification. Device simulations were carried out to investigate the performance of 5-micron-thick and 10-micron-thick GmAPDs 105. The doping profile for the simulated devices is shown in FIG. 5A and results of the simulations are shown in FIG. 5B (5-micron-thick photodiode) and FIG. 5C (10-micron-thick photodiode).

FIG. 5B and FIG. 5C plot the avalanche probability of 5-μm and 10-μm-thick photodiodes, respectively. The simulation assumes a cylindrical coordinate, axially symmetric photodiode, with r=0 being the center of the pixel. Both GmAPDs have the same implant and pixel dimensions suitable for 25-μm-pitch arrays. The 5-μm-thick GmAPD has a larger area with higher avalanche probability compared to a 10-μm-thick GmAPD. The thinner GmAPD (FIG. 5B) should have higher photon detection efficiency (PDE).

There was concern that a 5-μm-thick GmAPD could exhibit mechanical instability of the final thinned chip as residual oxide stress can bend the thin silicon and cause bump bonds to peel off even with an epoxy to adhere the photodiode array chip to the ROIC chip. Accordingly, two thicknesses for the epitaxial layer 240 were grown on different process-ready wafers 204. For comparison purposes, a comparable set of process-ready wafers 330 (having 5-micron-thick and 10-micron-thick silicon layers) were made using the process of FIG. 3B.

Figure 6:
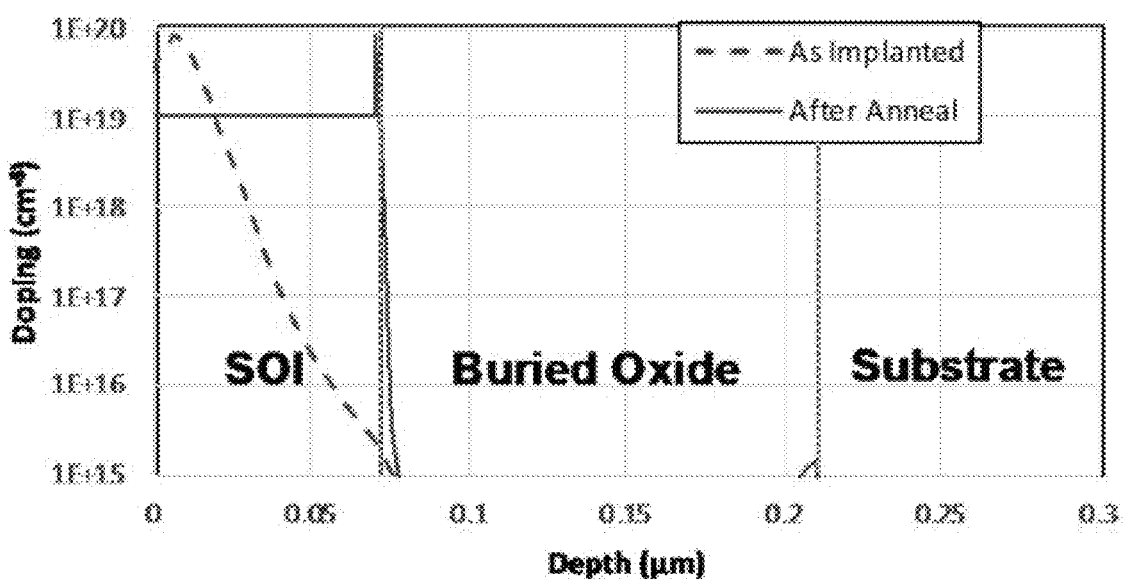
FIG. 6 plots simulations of dopant concentration after implantation (dashed line) and after an anneal (solid line) to homogenize the dopant concentration.

The SOI wafers 200 used to fabricate the example avalanche photodiodes had a 70-nm-thick p-type silicon top layer 220 on a 145-nm-thick buried oxide layer 210 (see FIG. 2A). To provide a backside passivation layer 129, the SOI wafer's silicon top layer 220 was implanted with $BF_2$ dopant (dose of $10^{14}$ cm$^{-2}$) at 5.5 keV and annealed at 1000° C. for 30 minutes to remove implant defects. Simulations of the anneal and dopant diffusion show that this anneal would spread the dopant uniformly throughout the 70-nm-thick top silicon layer 220, providing a final dopant concentration of $10^{19}$ cm$^{-3}$. The results of the diffusion simulation are shown in FIG. 6.

A high-resistivity, silicon epitaxial layer 240 for photodiode fabrication is then grown on the SOI wafer 200 utilizing a CVD process. The high-resistivity layer is grown to a thickness of microns for a first set of SOI wafers and to 10 microns for a second set of SOI wafers. There was a concern about whether the high implant dose would damage the silicon lattice of the top silicon layer 220 and introduce defects to the epitaxially-grown silicon. Accordingly, two different implant doses were tried on different sets of SOI wafers ($10^{14}$ cm$^{-2}$ and $3\times10^{13}$ cm$^{-2}$). After fabricating the GmAPDs 105 on these wafers, no differences in DCR or I-V characteristics were found.

Figure 7A:
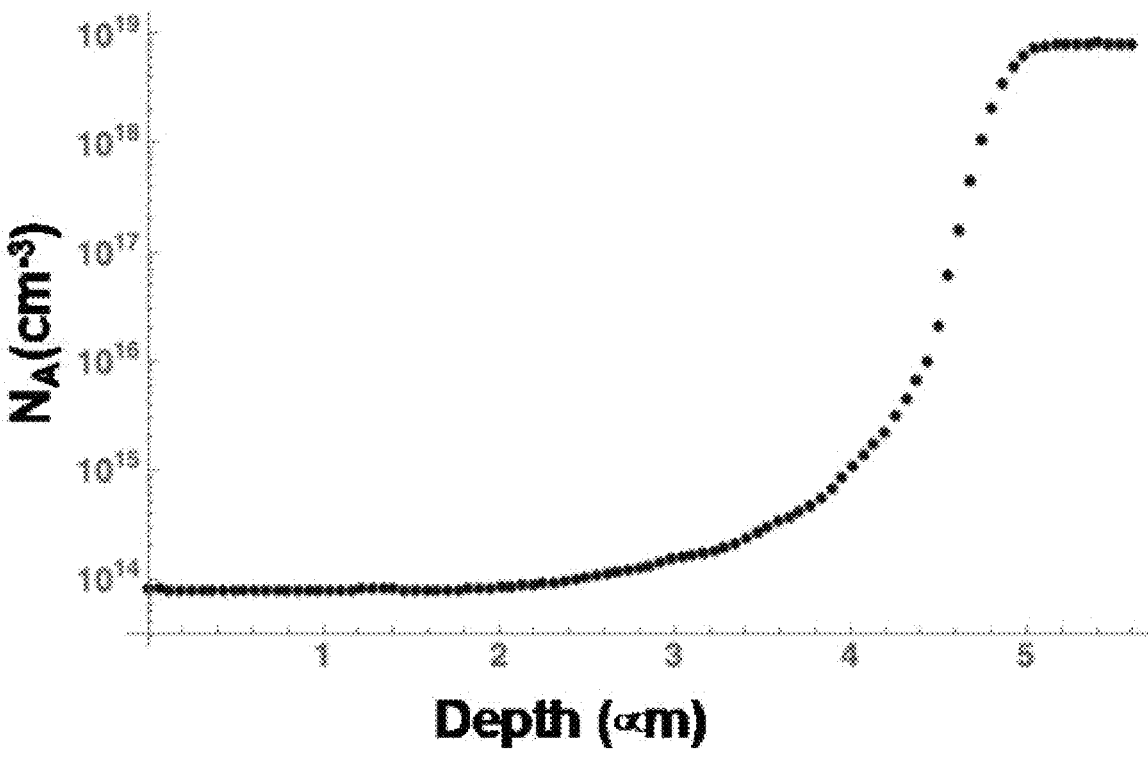
FIG. 7A plots measured dopant concentration as a function of depth into the substrate (in the passivation layer and epitaxial device layer) after epitaxial growth of the device layer.
Figure 7B:
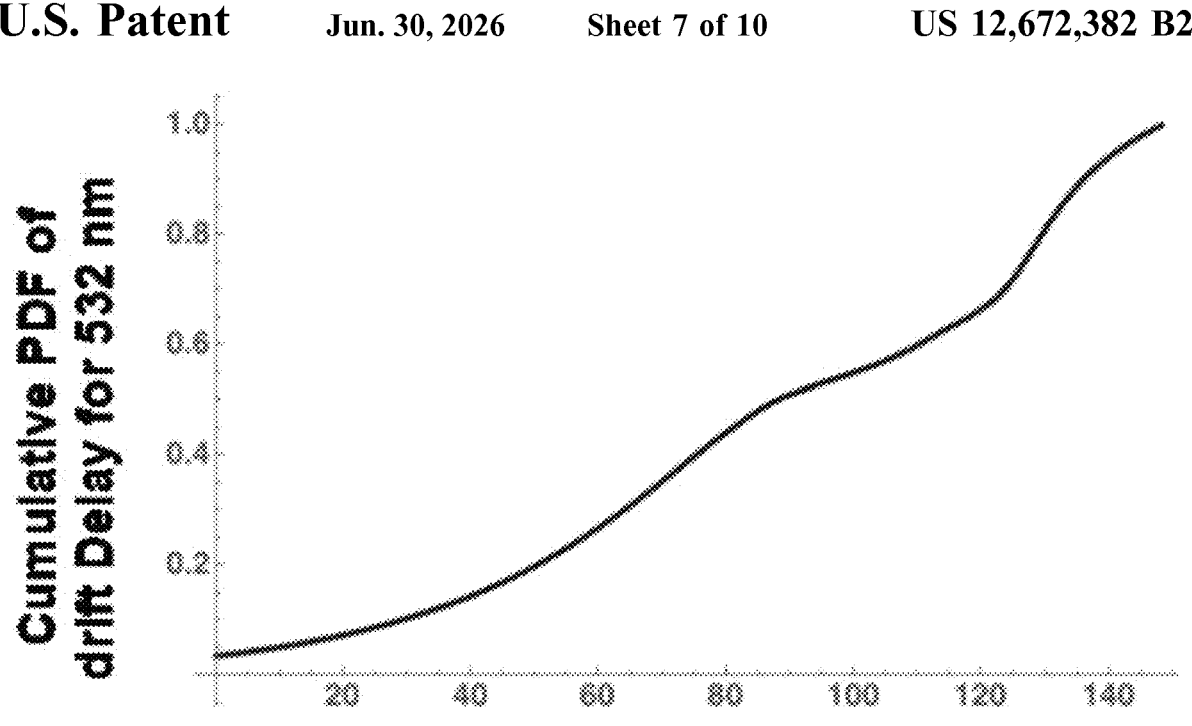
FIG. 7B plots the cumulative probability density function (PDF) of drift delay for an example avalanche photodiode for the dopant concentration of FIG. 7A.

Another concern with the present approach was unwanted diffusion of the uniformly distributed BF$_2$ dopant in the passivation layer 129 during the epitaxial growth of the epitaxial layer 240, since the growth temperature is high (1050° C.) and boron has a tendency to segregate at the growth interface. To assess this risk, the resulting doping profile was measured with spreading resistance profilometry and is plotted in FIG. 7A. Doping level of the passivation layer and epitaxial growth temperature were adjusted to mitigate unwanted diffusion of the dopant. The dopant concentration is low near the top surface of the epitaxial layer 240 (x=0) and remains high at the passivation layer 129 (beyond x=5 microns). This resulting doping profile was input as the back surface in a GmAPD simulator and tested for timing resolution and collection efficiency. The doping profile was found to be adequate to enable timing jitter<100 ps, as shown in FIG. 7B, and good collection efficiency. FIG. 7B plots the cumulative probability density function (PDF) of drift delay for 532-nm-wavelength photons being absorbed from the back surface (x=5 microns) of the avalanche photodiode. This PDF is used to estimate a mean drift delay of 100 ps and 1-sigma timing jitter of 33 ps.

Figure 7C:
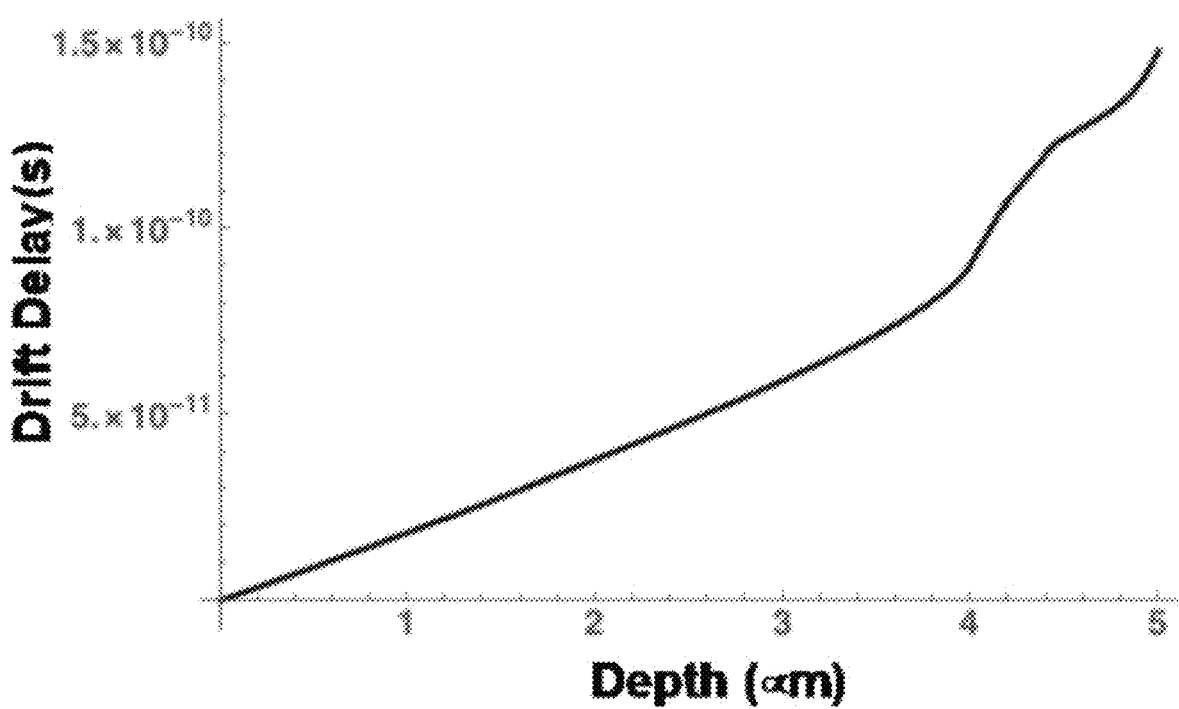
FIG. 7C plots the drift delay for charge to be collected when generated by absorption of a photon at different locations in the avalanche photodiode's absorbing region for the dopant concentration of FIG. 7A.
Figure 7D:
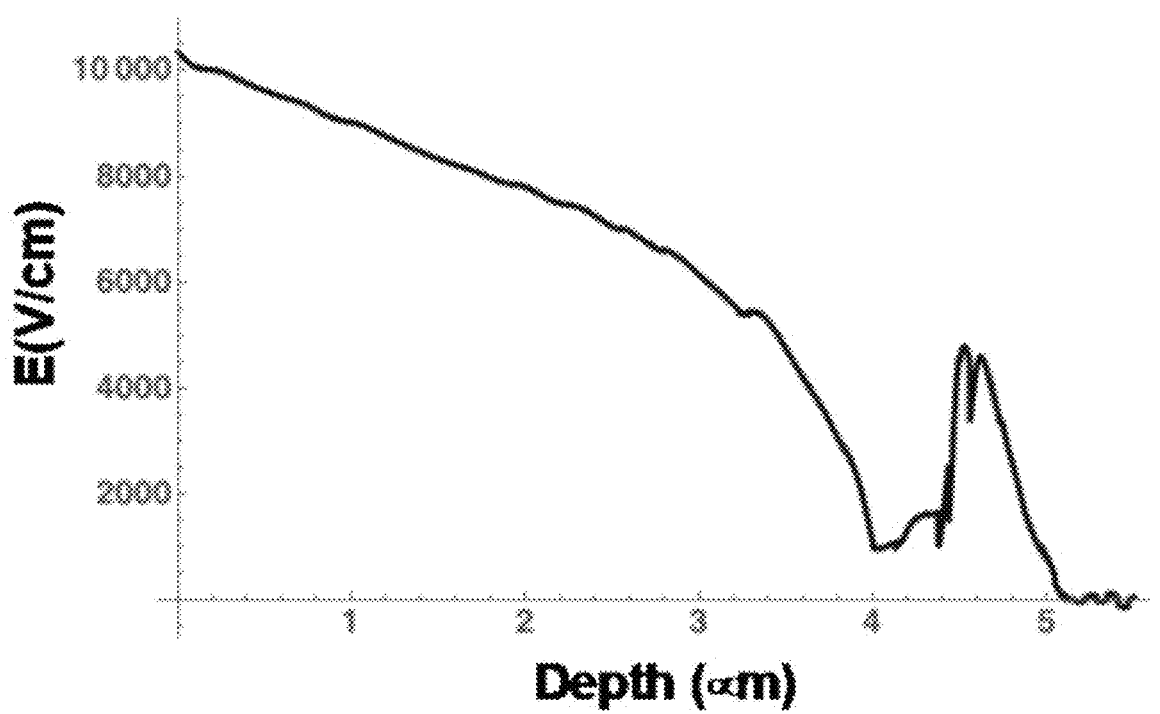
FIG. 7D plots the vertical electric field for the dopant concentration of FIG. 7A.

For completeness, FIG. 7C plots the drift delay for charge to be collected when carriers are generated by absorption of a photon at different locations in the absorbing region 128 of the GmAPD. FIG. 7D plots the vertical electric field for the dopant concentration of FIG. 7A. The vertical electrical field is calculated for a reverse bias voltage of 3 volts. The high field from 0 to 4 microns is caused by depletion, while the high field from 4 to 5 microns is due to the graded doping profile.

Arrays of avalanche photodiodes 105 in various formats for Geiger-mode operation were fabricated on the two types of process-ready wafers 204, 330 depicted in FIG. 3A and FIG. 3B. The photodiode fabrication process is described in detail in "Hybridization process for back-illuminated silicon Geiger-mode avalanche photodiode arrays," by Schuette, D. R. et al., (Proceedings of SPIE Defense, Security, and Sensing, Orlando, Florida, 2010), which publication is incorporated by reference in its entirety. The photodiode fabrication process includes defining the n+cathode 124, buried p+ layer for the anode 126, and substrate contacts. A portion of the structure of an avalanche photodiode 105 fabricated using this process is shown in FIG. 5A. After the avalanche photodiodes 105 are fabricated, under-bump metallization is performed to make the photodiode metal contacts 161, and then indium bumps are added to the wafer.

Figure 8:
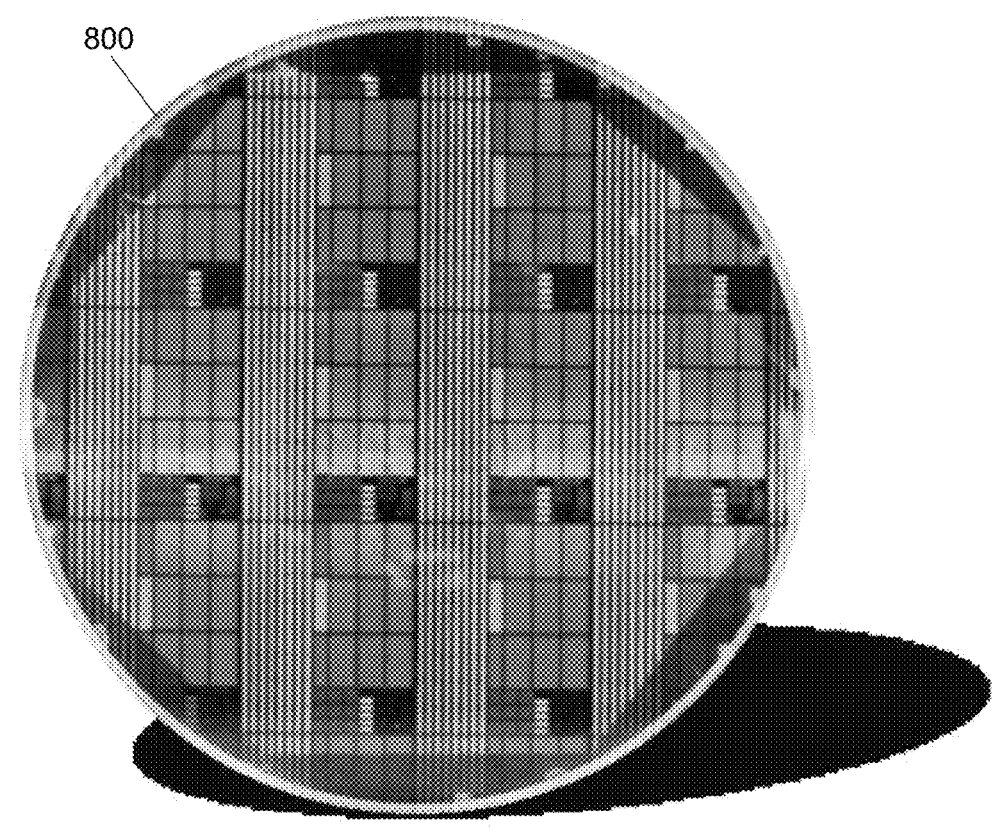
FIG. 8 is an image of an eight-inch finished wafer which was made starting with the process of FIG. 3A and has undergone a bump patterning process.

FIG. 8 shows an eight-inch finished wafer 800 which has undergone the bump patterning process. Various formats of arrays (different lengths and widths) are visible on the finished wafer 800.

After the bumps are added, the finished wafers 800 are diced into chips, and hybridized (via bump bonding) to matching ROICs 115. Afterwards, the chips having the avalanche photodiode arrays are thinned to remove the silicon substrate 202. For example, the silicon substrate 202 can be removed using the removal process described in "Rapid prototyping of single-photon-sensitive backside-illuminated silicon avalanche photodiode arrays," by Rhu, K. K. et al., (Proceeding of SPIE Defense+Commercial Sensing, Baltimore, MD, 2019), which publication is incorporated by reference in its entirety. The thinning process can include mechanical removal of most of the silicon substrate 202 (e.g., using grinding or a dicing saw) followed by a dry or wet etch that stops on the buried oxide layer 210.

Figure 9A:
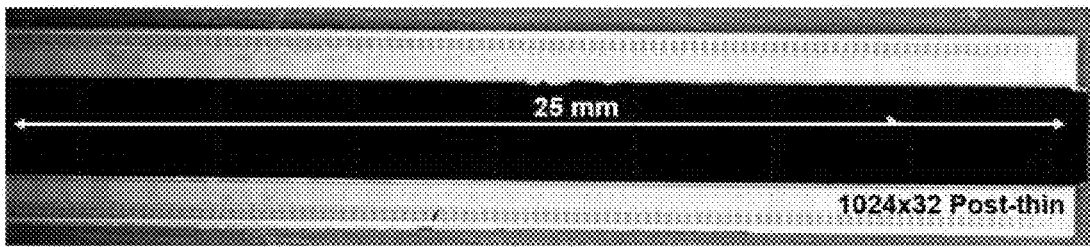
FIG. 9A is a microscope image of a chip having a 1024×32 array of avalanche photodiodes.
Figure 9B:
FIG. 9B plots dark count rates for the pixels of the array of Geiger-mode avalanche photodiodes of in FIG. 9A.

FIG. 9A is a microscope image of a chip having a 1024×32 array of avalanche photodiodes. The chip is bonded to a ROIC, which is not visible in the image. The device was tested for photodiode connectivity using DCR data (shown in FIG. 9B). The detected signals showed 99.4% connectivity (yielding pixels) after thinning the silicon substrate 202. The mechanical robustness and good electrical connectivity can allow production of thinner avalanche photodiodes and/or larger arrays (e.g., multi megapixel to several gigapixel arrays). In addition, the fabrication process allows microlenses to be integrated over each pixel using standard microlens fabrication processes.

A selective wet-etching process to remove the buried oxide layer 210 remaining on the chip and deposit an anti-reflection coating 130 for 532 nm wavelength was carried out. The detector showed no electrical degradation after this additional processing.

4. Device Performance

Figure 10:
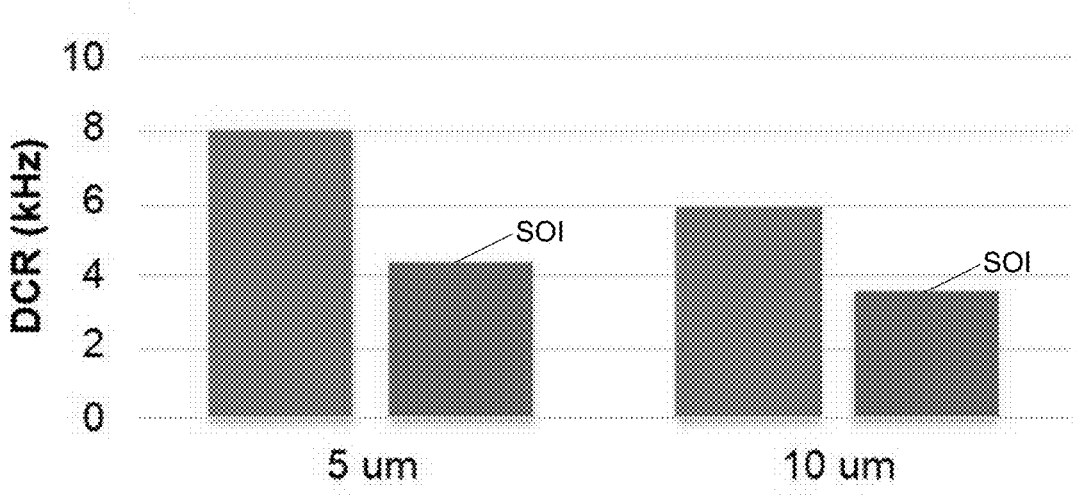
FIG. 10 compares the average dark count rate in kHz for Geiger-mode avalanche photodiodes fabricated on the two types of process-ready wafers (fabricated using the processes of FIG. 3A and FIG. 3B) and for two thicknesses of avalanche photodiodes operated as GmAPD devices.

DCRs of fabricated GmAPD arrays at the wafer-level were characterized on ten reticles per wafer, and a total of six wafers were measured at room temperature with 5 V reverse bias. The bar plot of FIG. 10 compares the average DCRs in kHz for the two types of process-ready wafers 204, 330 and two avalanche photodiode thicknesses (5 microns and 10 microns). The GmAPDs had an 8-micron radius on all wafers. The average DCR is lower for both 5-micron-thick (by nearly a factor of two) and 10-micron-thick GmAPDs fabricated using process-ready wafers 204 that were prepared from commercial SOT wafers 200 (bars labeled with "SOI" in FIG. 10). The reduction in DCR is likely due, at least in part, to the lower metallic contamination. The lower metallic contamination can also allow the wafers to be processed in cleaner processing equipment that may be used in mainstream semiconductor manufacturing. As a result, the new process can improve yield of avalanche photodiode arrays with lower DCR and that cost less to produce.

Optical characteristics were measured on finished 5-micron-thick avalanche photodiode arrays that were bonded to ROICs 115. These devices were packaged in dual-in-line packages and characterized using a 532 nm laser as an optical source. A 3-μm-diameter laser beam was raster scanned across the photodiode array at different reverse bias conditions to characterize the PDE. The photon flux was 0.27 photon/pixel/pulse.

Figure 11:
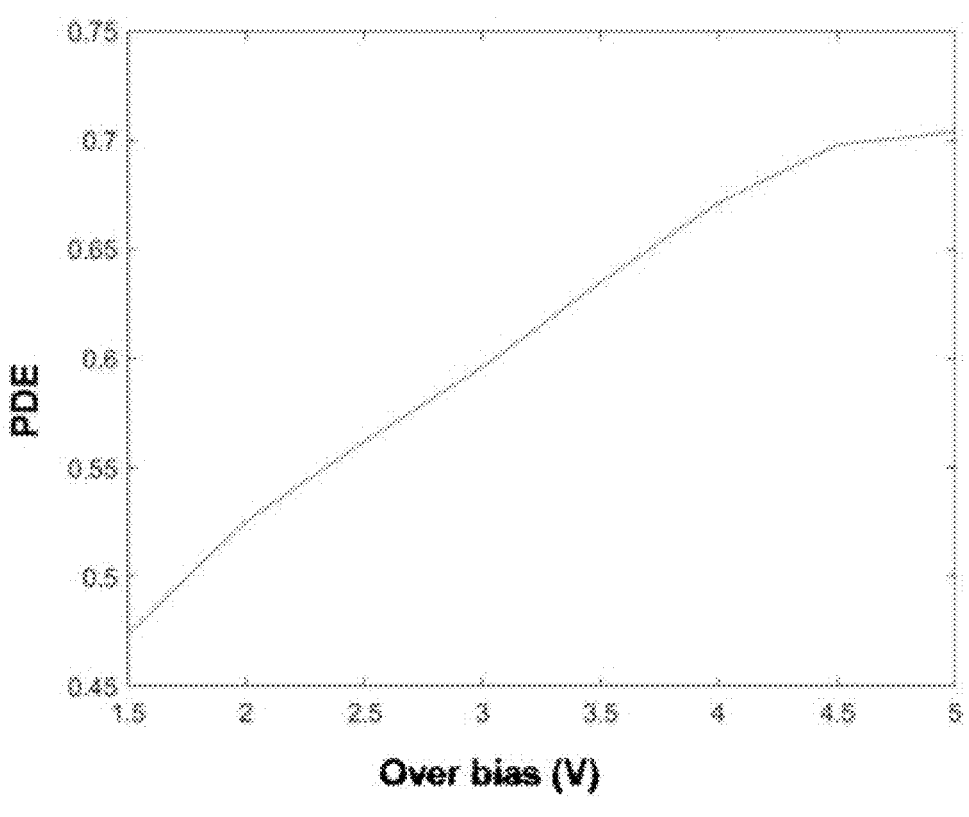
FIG. 11 plots photon detection efficiency as a function of reverse bias applied to a Geiger-mode avalanche photodiode.

Measurements of PDE are plotted in FIG. 11 as a function of reverse bias. The PDE increases with reverse bias, in agreement with simulations. At its peak, the PDE reached 70% which is close to 100% avalanche probability and collection efficiency given that the surface has about 140 nm of oxide, which would have reflected about 30% of the light at 532 nm.

Figure 12:
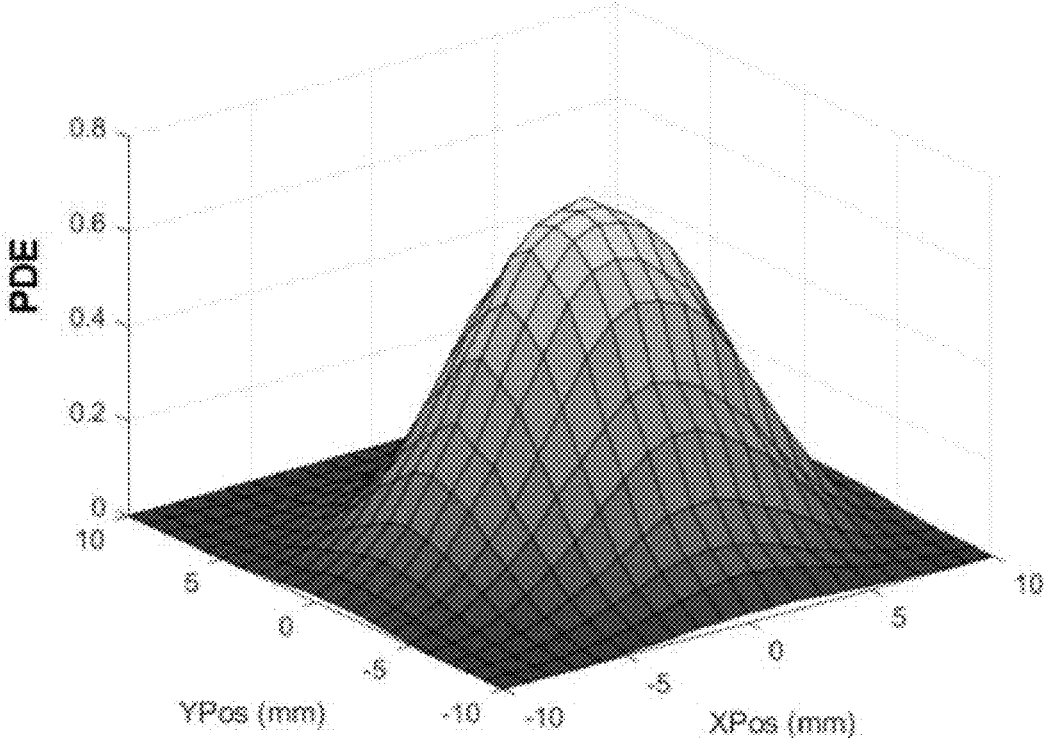
FIG. 12 is a three-dimensional plot of a Geiger-mode avalanche photodiode's spatial photon-detection-efficiency profile.

Pixels of the GmAPD array had a spatial efficiency profile that is plotted in FIG. 12 under 5 V reverse bias. The photodiode radius is 8 microns. The full width half max (FHWM) value of the spatial efficiency profile also increased with increasing reverse bias. The peak PDE is obtained with the 3-micron-diameter beam incident on the center of the photodiode.

5. Fabrication Methods

There are alternative approaches to fabricating the devices described above. Some examples of fabrication methods are summarized in the lists below.

(1) A method of fabricating a hybridized sensor, the method comprising: implanting ions into a silicon layer of a silicon-on-insulator wafer to create a passivation layer; growing a device layer on the passivation layer; forming a sensor array in the device layer; dicing the silicon-on-insulator wafer into a chip containing the sensor array; and hybridizing the chip to a read-out integrated circuit (ROTC).

(2) The method of (1), further comprising: before growing the device layer, annealing the passivation layer to remove defects.

(3) The method of (1) or (2), wherein growing the device layer comprises epitaxially depositing silicon on the passivation layer.

(4) The method of (1) or (2), wherein growing the device layer comprises depositing silicon to a thickness of up to 10 µm.

(5) The method of (1) or (2), wherein growing the device layer comprises depositing silicon to a thickness of up to 5 µm.

(6) The method of any one of (1) through (5), wherein the device layer as grown has a resistivity of at least 20 Ω-cm.

(7) The method of any one of (1) through (6), wherein implanting ions comprises implanting a $p^+$ dopant into the silicon layer.

(8) The method of any one of (1) through (7), wherein forming the sensor array in the device layer comprises forming a plurality of avalanche photodiodes.

(9) A method of fabricating a hybridized sensor, the method comprising: implanting ions into a semiconductor layer of a semiconductor-on-insulator (SOI) wafer to create a passivation layer, the SOI wafer comprising the semiconductor layer, a buried oxide layer, and a semiconductor substrate on a side of the buried oxide layer opposite the semiconductor layer; epitaxially growing a device layer on the passivation layer; forming a sensor in the device layer; forming a first metal contact electrically connected to the sensor; dicing the SOI wafer into a first chip containing the sensor; bump bonding the first chip to a read-out integrated circuit (ROIC) by electrically connecting the first metal contact to a second metal contact of the ROIC with a bump bond; and thinning the semiconductor substrate on the first chip so that optical radiation can enter the sensor from a surface of the sensor facing the buried oxide layer.

(10) The method of (9), wherein the semiconductor layer comprises silicon and has a thickness between 20 nm and 120 nm.

(11) The method of (9) or (10), wherein epitaxially growing the device layer comprises growing the device layer to a thickness between 500 nm and 10 µm.

(12) The method of any one of (9) through (11), wherein thinning the semiconductor substrate comprises removing all of the semiconductor substrate to the buried oxide layer.

(13) The method of (12), wherein removing all of the semiconductor substrate comprises: removing most of the semiconductor substrate mechanically; and removing a remaining portion of the semiconductor substrate by an etching process that stops on the buried oxide layer.

(14) The method of (12) or (13), further comprising: removing the buried oxide layer to expose the passivation layer; and depositing an anti-reflection coating over the passivation layer.

(15) The method of any one of (9) through (14), wherein the sensor is an avalanche photodiode, the method further comprising: biasing the avalanche photodiode; and determining a dark count rate for the avalanche photodiode.

(16) A method of fabricating a hybridized sensor array, the method comprising: implanting ions into a semiconductor layer of a semiconductor-on-insulator (SOI) wafer to create a passivation layer, the SOI wafer comprising the semiconductor layer, a buried oxide layer, and a semiconductor substrate on a side of the buried oxide layer opposite the semiconductor layer; epitaxially growing a device layer on the passivation layer; forming sensors in at least one array in the device layer; forming first metal contacts electrically connected to the sensors in the at least one array; dicing the SOI wafer into a first chip containing an array of sensors of the at least one array; bump bonding the first chip to a read-out integrated circuit (ROIC) by electrically connecting the first metal contacts to second metal contacts of the ROIC with a plurality of bump bonds; and thinning the semiconductor substrate on the first chip so that optical radiation can enter the array of sensors from a surface of the array of sensors facing the buried oxide layer.

(17) The method of (16), wherein epitaxially growing the device layer comprises growing the device layer to a thickness between 500 nm and 5 µm.

(18) The method of (16) or (17), wherein thinning the semiconductor substrate comprises removing all of the semiconductor substrate to the buried oxide layer.

(19) The method of any one of (16) through (18), further comprising: removing the buried oxide layer to expose the passivation layer; and depositing an anti-reflection coating over the passivation layer.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the components so conjoined, i.e., components that are conjunctively present in some cases and disjunctively present in other cases. Multiple components listed with "and/or" should be construed in the same fashion, i.e., "one or more" of the components so conjoined. Other components may optionally be present other than the components specifically identified by the "and/or" clause, whether related or unrelated to those components specifically identified. Thus, as a non-limiting example, a reference to "A and/or B", when used in conjunction with open-ended language such as "comprising" can refer, in one embodiment, to A only (optionally including components other than B); in another embodiment, to B only (optionally including components other than A); in yet another embodiment, to both A and B (optionally including other components); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of components, and, optionally, additional unlisted items. Only terms clearly indicated to the contrary, such as "only one of" or "exactly one of," or, when used in the claims, "consisting of," will refer to the inclusion of exactly one component of a number or list of components. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of," when used in the claims, shall have its ordinary meaning as used in the field of patent law.

As used herein in the specification and in the claims, the phrase "at least one," in reference to a list of one or more components, should be understood to mean at least one component selected from any one or more of the components in the list of components, but not necessarily including at least one of each and every component specifically listed within the list of components and not excluding any combinations of components in the list of components. This definition also allows that components may optionally be present other than the components specifically identified within the list of components to which the phrase "at least one" refers, whether related or unrelated to those components specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including components other than B); in another embodiment, to at least one, optionally including more than one, B, with no A present (and optionally including components other than A); in yet another embodiment, to at least one, optionally including more than one, A, and at least one, optionally including more than one, B (and optionally including other components); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of fabricating a hybridized sensor, the method comprising:

implanting ions into a silicon layer of a silicon-on-insulator (SOI) wafer to create a passivation layer;

growing a device layer on the passivation layer;

forming a sensor array in the device layer;

forming an oxide layer over the sensor array;

forming metal contacts through the oxide layer to cathodes of sensors in the sensor array;

dicing the SOI wafer to form a chip containing the sensor array;

hybridizing the chip to a read-out integrated circuit (ROIC) using the metal contacts;

after hybridizing the chip, removing at least a bulk substrate from the SOI wafer to form a planar surface on the insulator of the SOI wafer or on the passivation layer, the planar surface extending across the sensor array; and after removing at least the bulk substrate, depositing an antireflection coating on or over the planar surface without etching into the chip a distance into or through the device layer prior to depositing the antireflection coating.

2. The method of claim 1, further comprising:

before growing the device layer, annealing the passivation layer to remove defects.

3. The method of claim 1, wherein growing the device layer comprises epitaxially depositing silicon on the passivation layer.

4. The method of claim 1, wherein growing the device layer comprises depositing silicon to a thickness of up to 10 μm.

5. The method of claim 1, wherein growing the device layer comprises depositing silicon to a thickness of up to 5 μm.

6. The method of claim 1, wherein the device layer as grown has a resistivity of at least 20 Ω-cm.

7. The method of claim 1, wherein implanting ions comprises:

implanting a $p^+$ dopant into the silicon layer.

8. The method of claim 1, wherein forming the sensor array in the device layer comprises forming a plurality of avalanche photodiodes.

9. A method of fabricating a hybridized sensor, the method comprising:

implanting ions into a semiconductor layer of a semiconductor-on-insulator (SOI) wafer to create a passivation layer, the SOI wafer comprising the semiconductor layer, a buried oxide layer, and a semiconductor substrate on a side of the buried oxide layer opposite the semiconductor layer;

epitaxially growing a device layer on the passivation layer;

forming a sensor comprising a multiplier region in the device layer;

forming a first metal contact electrically connected to the sensor;

dicing the SOI wafer into a first chip containing the sensor;

bump bonding the first chip to a read-out integrated circuit (ROIC) chip by electrically connecting the first metal contact to a second metal contact of the ROIC chip with a bump bond;

after bump bonding the first chip to the ROIC chip, thinning the semiconductor substrate on the first chip to form a planar surface so that optical radiation can enter the sensor from a surface of the sensor facing the buried oxide layer, wherein the planar surface extends across the sensor and is located on the insulator layer of the SOI wafer or on the passivation layer; and after thinning the semiconductor substrate, depositing an antireflection coating on or over the planar surface without etching into the first chip a distance into or through the device layer prior to depositing the antireflection coating.

10. The method of claim 9, wherein the semiconductor layer comprises silicon and has a thickness between 20 nm and 120 nm.

11. The method of claim 9, wherein epitaxially growing the device layer comprises growing the device layer to a thickness between 500 nm and 10 μm.

12. The method of claim 9, wherein thinning the semiconductor substrate comprises removing all of the semiconductor substrate to the buried oxide layer.

13. The method of claim 12, wherein removing all of the semiconductor substrate comprises:

removing most of the semiconductor substrate mechanically; and removing a remaining portion of the semiconductor substrate by an etching process that stops on the buried oxide layer.

14. The method of claim 12, further comprising:

removing the buried oxide layer to expose the passivation layer; and depositing an anti-reflection coating on or over the passivation layer.

15. The method of claim 9, wherein the sensor is an avalanche photodiode, the method further comprising:

biasing the avalanche photodiode; and determining a dark count rate for the avalanche photodiode.

16. A method of fabricating a hybridized sensor array, the method comprising:

implanting ions into a semiconductor layer of a semiconductor-on-insulator (SOI) wafer to create a passivation layer, the SOI wafer comprising the semiconductor layer, a buried oxide layer, and a semiconductor substrate on a side of the buried oxide layer opposite the semiconductor layer;

epitaxially growing a device layer on the passivation layer;

forming sensors in at least one array in the device layer wherein each sensor in the at least one array comprises a multiplier region;

forming first metal contacts electrically connected to the sensors in the at least one array;

dicing the SOI wafer into a first chip containing an array of sensors of the at least one array;

bump bonding the first chip to a read-out integrated circuit (ROIC) chip by electrically connecting the first metal contacts to second metal contacts of the ROIC chip with a plurality of bump bonds;

after bump bonding the first chip, thinning the semiconductor substrate on the first chip to form a planar surface so that optical radiation can enter the array of sensors from a surface of the array of sensors facing the buried oxide layer, wherein the planar surface extends across the array of sensors; and after forming the planar surface by thinning the semiconductor substrate, depositing an antireflection coating on or over the planar surface.

17. The method of claim 16, wherein epitaxially growing the device layer comprises growing the device layer to a thickness between 500 nm and 5 μm.

18. The method of claim 16, wherein thinning the semiconductor substrate comprises removing all of the semiconductor substrate to the buried oxide layer.

19. The method of claim 18, further comprising:

removing the buried oxide layer to expose the passivation layer; and depositing an anti-reflection coating on or over the passivation layer.

* * * * *